United States Patent
Reed et al.

(10) Patent No.: US 8,213,259 B2
(45) Date of Patent: *Jul. 3, 2012

(54) NON-VOLATILE MEMORY CELL WITH RESISTIVE SENSE ELEMENT BLOCK ERASE AND UNI-DIRECTIONAL WRITE

(75) Inventors: Daniel S. Reed, Maple Plain, MN (US); Yong Lu, Edina, MN (US); Andrew John Carter, Minneapolis, MN (US); Hai Li, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 12/903,011

(22) Filed: Oct. 12, 2010

(65) Prior Publication Data

US 2011/0026305 A1 Feb. 3, 2011

Related U.S. Application Data

(63) Continuation of application No. 12/501,077, filed on Jul. 10, 2009, now Pat. No. 7,885,097.

(60) Provisional application No. 61/104,402, filed on Oct. 10, 2008.

(51) Int. Cl.
*G11C 7/12* (2006.01)
*G11C 8/08* (2006.01)
*G11C 11/21* (2006.01)
*G11C 11/02* (2006.01)
*G11C 7/22* (2006.01)

(52) U.S. Cl. .............. 365/242; 365/189.16; 365/171; 365/173; 365/148; 365/163; 365/158

(58) Field of Classification Search ............ 365/148, 365/158, 163, 171, 173, 182, 189.16, 242
See application file for complete search history.

(56) References Cited

U.S. PATENT DOCUMENTS

| | | | | |
|---|---|---|---|---|
| 3,691,535 | A * | 9/1972 | Williams | 365/184 |
| 5,412,596 | A * | 5/1995 | Hoshiba | 365/145 |
| 6,341,085 | B1 | 1/2002 | Yamagami et al. | |

(Continued)

FOREIGN PATENT DOCUMENTS

WO 2007100626 A2 9/2007

OTHER PUBLICATIONS

PCT/ISA/210 International Search Report and PCT/ISA/237 Written Opinion for PCT/US2010/041134 from the EPO.

*Primary Examiner* — J. H. Hur
(74) *Attorney, Agent, or Firm* — Hall Estill Attorneys at Law

(57) ABSTRACT

A non-volatile memory cell and associated method of use. In accordance with some embodiments, the memory cell includes a transistor comprising source and drain regions spanned by a gate region, and a resistive sense element (RSE) connected to the drain region of the transistor. The RSE is programmed to a first resistance by flowing a first write current through the RSE and then through the drain and source regions of the transistor. The RSE is programmed to a second resistance by flowing a second write current through the drain region and then through the RSE, the second write current bypassing the source region.

20 Claims, 7 Drawing Sheets

U.S. PATENT DOCUMENTS

| | | |
|---|---|---|
| 6,617,642 B1 | 9/2003 | Georgescu |
| 6,757,842 B2 | 6/2004 | Harari et al. |
| 6,800,897 B2 | 10/2004 | Baliga |
| 6,940,742 B2 | 9/2005 | Yamamura |
| 6,944,052 B2 | 9/2005 | Subramanian et al. |
| 7,009,876 B2 * | 3/2006 | Okazawa ............ 365/171 |
| 7,045,840 B2 | 5/2006 | Tamai et al. |
| 7,180,140 B1 | 2/2007 | Brisbin et al. |
| 7,272,034 B1 | 9/2007 | Chen et al. |
| 7,362,618 B2 | 4/2008 | Harari et al. |
| 7,397,713 B2 | 7/2008 | Harari et al. |
| 7,432,574 B2 | 10/2008 | Nakamura et al. |
| 7,542,356 B2 | 6/2009 | Lee et al. |
| 7,646,629 B2 | 1/2010 | Hamberg et al. |
| 7,732,881 B2 | 6/2010 | Wang |
| 7,885,097 B2 * | 2/2011 | Reed et al. ............ 365/158 |
| 2004/0114438 A1 | 6/2004 | Morimoto |
| 2005/0122768 A1 | 6/2005 | Fukumoto |
| 2006/0044703 A1 | 3/2006 | Inomata et al. |
| 2008/0007993 A1 | 1/2008 | Saitoh et al. |
| 2008/0203443 A1 * | 8/2008 | Wilson et al. ............ 257/260 |
| 2009/0161408 A1 | 6/2009 | Tanigami et al. |

* cited by examiner

NON-VOLATILE MEMORY CELL WITH RESISTIVE SENSE ELEMENT BLOCK ERASE AND UNI-DIRECTIONAL WRITE

RELATED APPLICATIONS

This application makes a claim of domestic priority under 35 U.S.C. §119(e) to U.S. Provisional Patent Application No. 61/104,402 filed Oct. 10, 2008.

BACKGROUND

Data storage devices can be used to store and retrieve user data in a fast and effective manner. Some data storage devices utilize a semiconductor array of solid-state memory cells to store data. The memory cells can be volatile or non-volatile. Some non-volatile memory cells can be provided with a 1T1R configuration with a single transistor ("T") and a single programmable resistive sense element ("R").

The resistive sense element is programmable to different resistive states through the application of write currents to the memory cell, and these different resistive states can be used to denote different logical states (e.g., logical 0, 1, 10, etc.). The programmed state of the resistive sense element can be sensed using a sense amplifier to detect a voltage generated by passage of a read current through the memory cell. A number of resistive sense element (RSE) constructions are known, including without limitation magnetic e transfer random access memory (STRAM), resistive random access memory (RRAM), phase change random access memory (PCRAM), and programmable metallic cells (PMCs).

The memory cell transistor serves as a switching device to facilitate access to the memory cell during write and read operations, and to decouple the memory cell from adjacent cells at other times. The cell transistor may be realized as an n-channel metal oxide semiconductor field effect transistor (NMOSFET).

The cell transistor will be sized to accommodate the relatively large bi-directional write currents used to program the RSE to different resistive states, and can require a substantially greater semiconductor area than the associated RSE in the cell. The size of the cell transistor can thus serve as a limiting factor in achieving greater areal data storage densities in a semiconductor array.

SUMMARY

Various embodiments of the present invention are generally directed to a non-volatile memory cell and method of use therefor.

In accordance with some embodiments, the memory cell includes a transistor comprising source and drain regions spanned by a gate region, and a resistive sense element (RSE) connected to the drain region of the transistor. The RSE is programmed to a first resistance by flowing a first write current through the RSE and then through the drain and source regions of the transistor. The RSE is programmed to a second resistance by flowing a second write current through the drain region and then through the RSE, the second write current bypassing the source region.

These and other features and advantages which characterize the various embodiments of the present invention can be understood in view of the following detailed discussion and the accompanying drawings.

DETAILED DESCRIPTION

Figure 1:
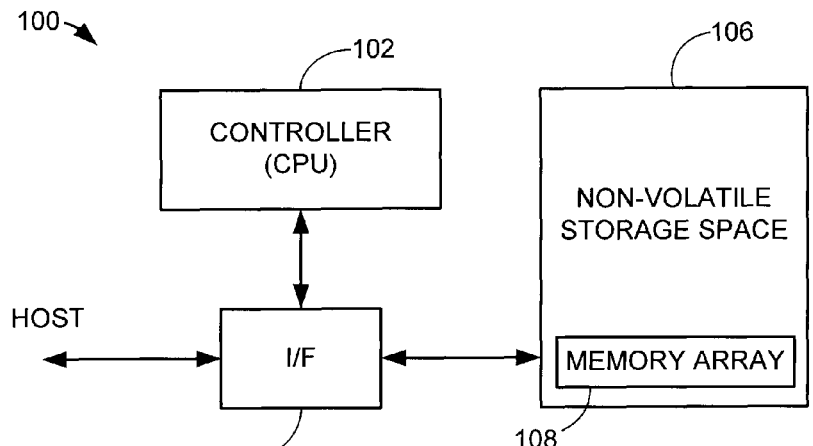
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention.

Top level control of the device 100 in FIG. 1 is carried out by a controller 102, which may be a programmable or hardware based microcontroller. The controller 102 communicates with a host device via a controller interface (I/F) circuit 104. A memory space 106 comprises a number of memory arrays 108. Each array 108 comprises a block of semiconductor memory of selected storage capacity. In some embodiments, the device is characterized as a solid-state drive (SSD).

Figure 2:
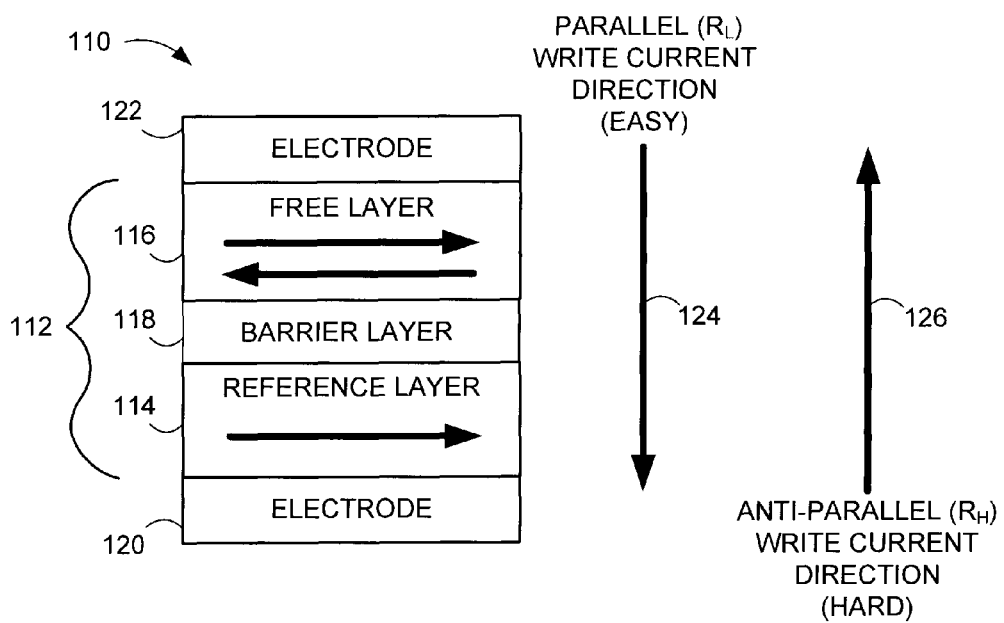
FIG. 2 shows an exemplary construction for a resistive sense element (RSE) of the memory array of FIG. 1 in accordance with some embodiments.

FIG. 2 shows a resistive sense element (RSE) 110 used in various memory cells of the memory array 108 of FIG. 1 to store data. The RSE 110 is characterized in FIG. 2 as a spin-torque transfer random access memory (STRAM), although other RSE constructions can be used. The STRAM RSE includes a magnetic tunneling junction (MTJ) 112 with a fixed reference layer 114, a free layer 116 and a tunneling barrier layer 118. The MTJ 112 is bounded by electrodes 120, 122. In some embodiments, the electrodes comprise spin polarizing material that uniformly orients the spin of current passing through the RSE MTJ 112.

The reference layer 114 has a fixed magnetic orientation in a selected direction. This fixed magnetic orientation can be established in a number of ways, such as via pinning to a separate magnet (not shown). The free layer 116 has a selectively programmable magnetic orientation that can be parallel or anti-parallel with the selected direction of the reference layer 114. Other respective magnetization orientations can be used, such as orientations substantially perpendicular to those shown in FIG. 2.

A low resistance state $R_L$ for the MTJ 112 is achieved when the magnetization of the free layer 116 is oriented to be substantially in the same direction (parallel) as the magnetization of the reference layer 114. To orient the MTJ 112 in the parallel low resistance state, a write current 124 passes through the MTJ 112 so that the magnetization direction of the reference layer 114 sets the magnetic orientation of the free layer 116. Since electrons flow in the direction opposite to the direction of current, the write current direction passes from the free layer 116 to the reference layer 114, and the electrons travel from the reference layer 114 to the free layer 116.

A high resistance state $R_H$ for the MTJ 112 is established in the anti-parallel orientation in which the magnetization direction of the free layer 116 is substantially opposite that of the reference layer 114. To orient the MTJ 112 in the anti-parallel resistance state, a write current 126 passes through the MTJ 112 from the reference layer 114 to the free layer 116 so that spin-polarized electrons flow into the free layer 116 in the opposite direction.

A different logical state is assigned to each of the programmable resistances of the MTJ. In some embodiments, the low resistance, parallel state is used to represent a logical 0, and the high resistance, anti-parallel state is used to represent a logical 1. Additional programmed states can be used when the MTJ is configured to store multiple bits. For example, programmed resistances R1<R2<R3<R4 can be used to respectively store multi-bit values "00," "01," "10" and "11."

RSEs such as 110 can have asymmetric write characteristics in that it can require greater write effort to switch the programmed state in one direction as compared to another other direction. For example, with respect to the MTJ 112 in FIG. 2 it has been found that writing to the anti-parallel high resistance $R_H$ state can require higher magnitudes of driving voltage and driving current as compared to the writing of the parallel low resistance $R_L$ state. Moreover, the relative ordering of the RSE and a switching device within a memory cell can contribute to asymmetric write characteristics, since the effective gate voltage may be lower when the direction of write current passes through the transistor prior to the RSE.

Accordingly, various embodiments of the present invention are generally directed to a memory cell comprising a switching device and a resistive sense element (RSE) having a hard programming direction and an easy programming direction. An erase operation is carried out to program the RSE in the hard programming direction by forward biasing a body-drain junction of the switching device. A write operation is carried out to program the RSE in the easy direction by applying a gate control voltage to the switching device and passing write current through a drain-source junction of the device.

As explained below, this provides a number of advantages including reduced metallization and control circuitry requirements. Smaller switching devices with reduced current carrying requirements can be utilized, promoting higher data storage densities. The memory cell configuration also supports higher throughput block level read and write schemes, such as page-mode read and write operations.

Figure 3A:
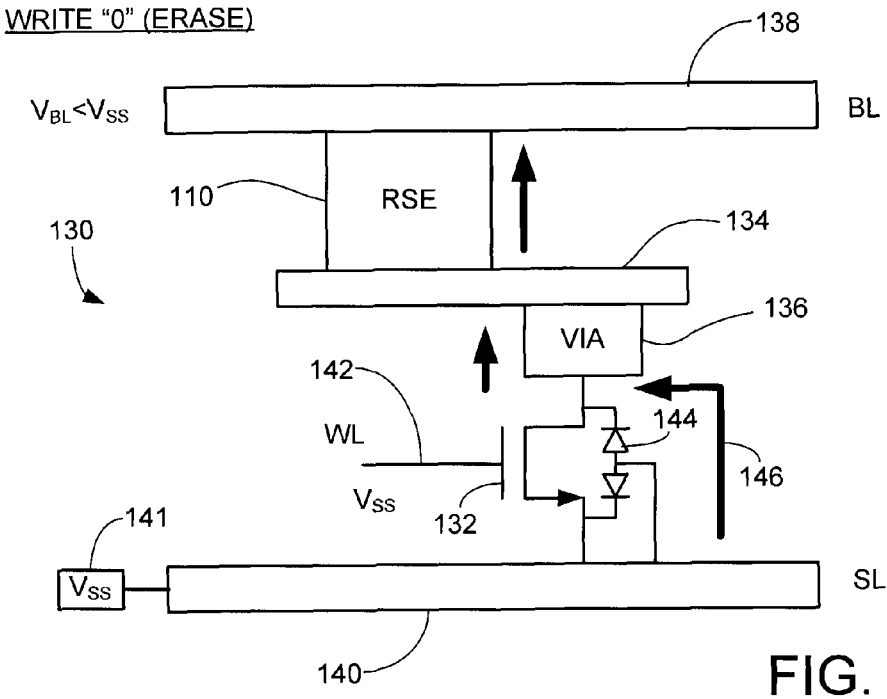
FIGS. 3A-3B show respective erase and uni-directional writes of a memory cell of the device of FIG. 1 in accordance with various embodiments.
Figure 3B:
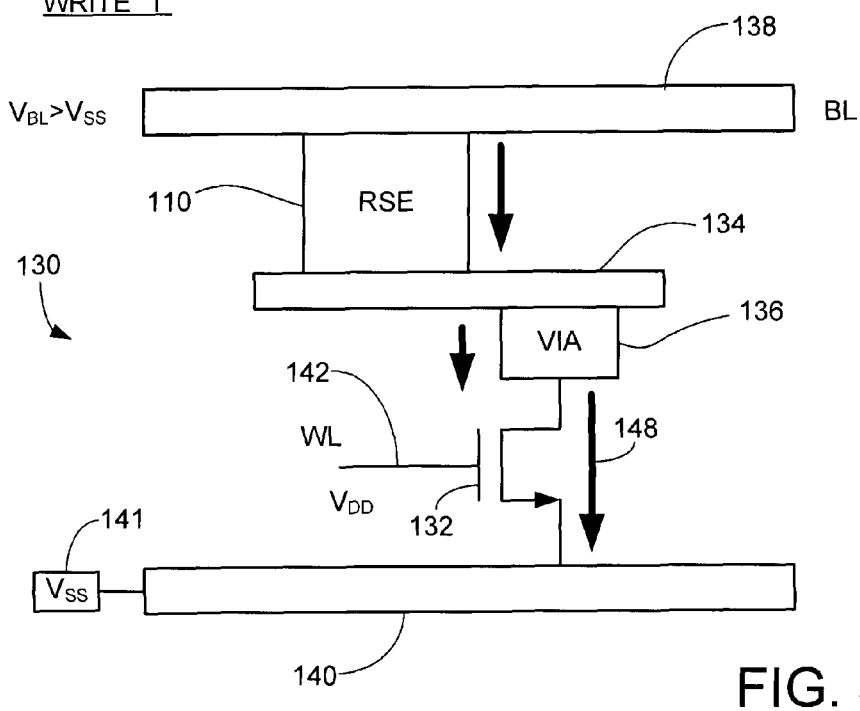

FIGS. 3A-3B shows an exemplary memory cell 130 constructed and operated in accordance with various embodiments. The memory cell 130 includes an RSE 110 connected in series with a switching device 132. The RSE 110 can be characterized as the MTJ 112 in FIG. 2, although other RSE configurations can readily be used including but not limited to RRAM, MRAM, PCRAM and PMCs. The switching device 132 can be characterized as a metal oxide semiconductor field effect transistor (MOSFET), although other switch configurations can be used including programmable elements.

Support structures within the memory cell 110 including an electrode layer 134 and a via 136 interconnect the RSE 110 and the switching device (transistor) 132. A first control line 138, characterized as a bit line BL is connected to an upper portion of the RSE 110. A second control line 140, characterized as a reference line, is set to a fixed control (reference) voltage $V_{SS}$, such as ground or some other reference level via reference source 141. The control line 140 can take any number of suitable forms, such as a ground plane, in which case the reference source 141 can be characterized as a ground termination.

The transistor 132 includes respective drain, source and gate terminals. The drain terminal is connected to the RSE 110 as shown (by way of the via 136 and electrode 138). The source terminal of the transistor 132 is connected to the reference voltage source 141. The gate terminal of the transistor 132 receives a gate control voltage input supplied by a word line WL 142.

Erase operations to write the RSE 110 to a first resistive state, such as logical 0, are shown in FIG. 3A. The erase operations are carried out in the hard programming direction for the RSE 110 and can be initiated by setting the voltage $V_{BL}$ of the BL 138 to a level less than the fixed voltage $V_{SS}$ ($V_{BL} < V_{SS}$), and by setting the WL 142 to the fixed reference voltage $V_{SS}$.

When the $V_{BL}$ voltage is sufficiently low, a body-drain diode junction 144 of the transistor 132 will become forward biased and allow a first write (programming) current 146 to flow from the body of the transistor through the drain and to the RSE 110. In FIG. 3A, the body-drain PN junction 144 is explicitly shown as a diode, but it will be understood that this is merely for purposes of illustration; the junction 144 is a characteristic of the transistor 142 and does not represent an additional diode circuit element.

Write operations to write the RSE 110 to a second resistive state, such as logical 1, are shown in FIG. 3B. The write operations are carried out in the easy programming direction for the RSE 110 and are initiated by applying a suitable gate control voltage, such as $V_{DD}$ to the word line WL 142 ($V_{DD} > V_{SS}$) and setting the voltage VBL of the BL 138 to a level greater than the fixed voltage $V_{SS}$ ($V_{BL} > V_{SS}$). This allows a second write current 148 to flow from the BL 138, through the RSE 110 and across the drain-source junction of the transistor 132.

The second write current 148 flows in the opposite direction through the RSE 110 as compared to the first write current 146, and programs the RSE to a different resistive state. It is contemplated that the body-drain diode current 146 can potentially be larger than the normal source-drain current 148 of the transistor. The transistor 132 can accordingly be sized to accommodate the lower current requirements of the second write current 148, providing a smaller overall cell size and larger cell densities in a given semiconductor area. Driver circuitry and metallization processing to form separate conductors for the second control line 140 can be eliminated, since the cell 130 is continuously maintained at the fixed reference voltage $V_{SS}$ during operation of the device.

Figure 4:
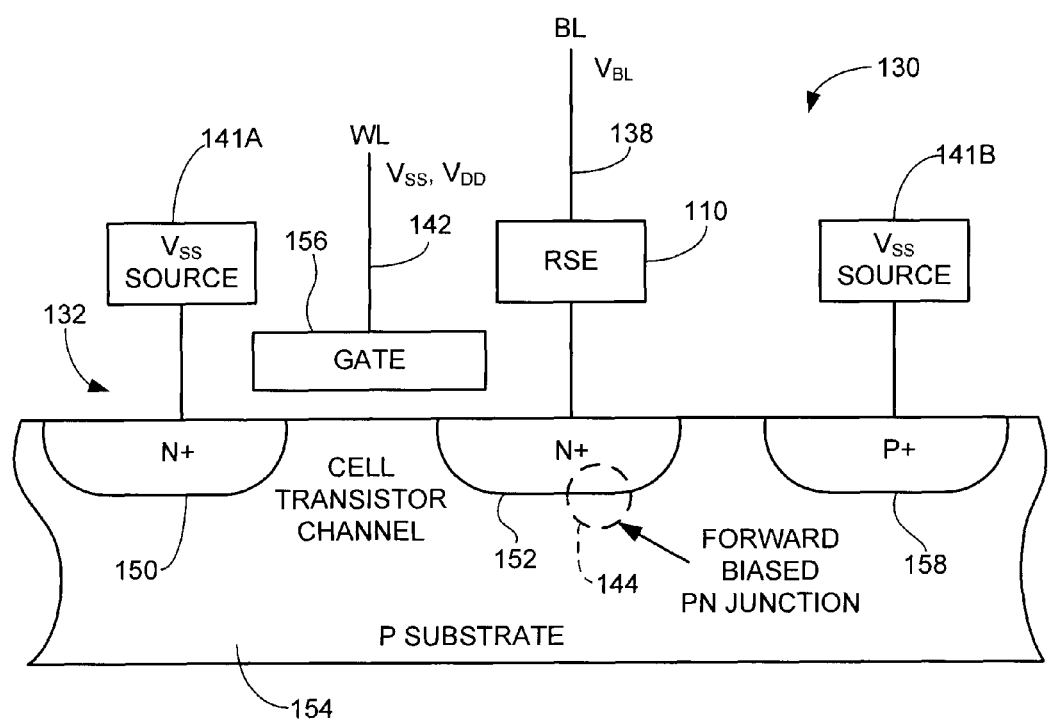
FIG. 4 is an elevational representation of the memory cell of FIGS. 3A-3B.

FIG. 4 provides an exemplary elevational semiconductor layout of the memory cell 130 of FIGS. 3A-3B in accordance with some embodiments. Other layouts can readily be used. N+ doped regions 150, 152 are provided in a P substrate 154 to form respective source and drain regions of the cell transistor 132. A control gate 156 is coupled to the word line WL 142 and spans the source and drain regions 150, 152 to selectively control transistor operation.

The source region 150 is permanently maintained at the $V_{SS}$ voltage via $V_{SS}$ source 141A. The drain region 152 is coupled to the RSE 110 as in FIGS. 3A-3B. A P+ contact region 158 is formed in the substrate 154 to facilitate a permanent connection to a second VSS source 141B (which may be the same source as 141A).

The forward biased PN junction 144 of FIG. 3A is denoted in FIG. 4 along the boundary between the P material of the substrate 154 and the N+ drain region 152. The erase current 146 in FIG. 3A passes from the $V_{SS}$ source 141B and through the P+ contact 158, P substrate 154 and N+ drain region 152 to the RSE 110. This body-drain current will flow while the voltage $V_{BL}$ is maintained below $V_{SS}$ and the gate 156 is maintained at $V_{SS}$.

The write current 148 of FIG. 3B will flow from the bit line BL 138, through the RSE 110 to the N+ drain region 152, across the cell transistor channel to the N+ source region 150, and to the VSS source 141A. This write current will flow responsive to $V_{BL}$ being greater than $V_{SS}$, and the gate 156 being set to $V_{DD}$.

Figure 5A:
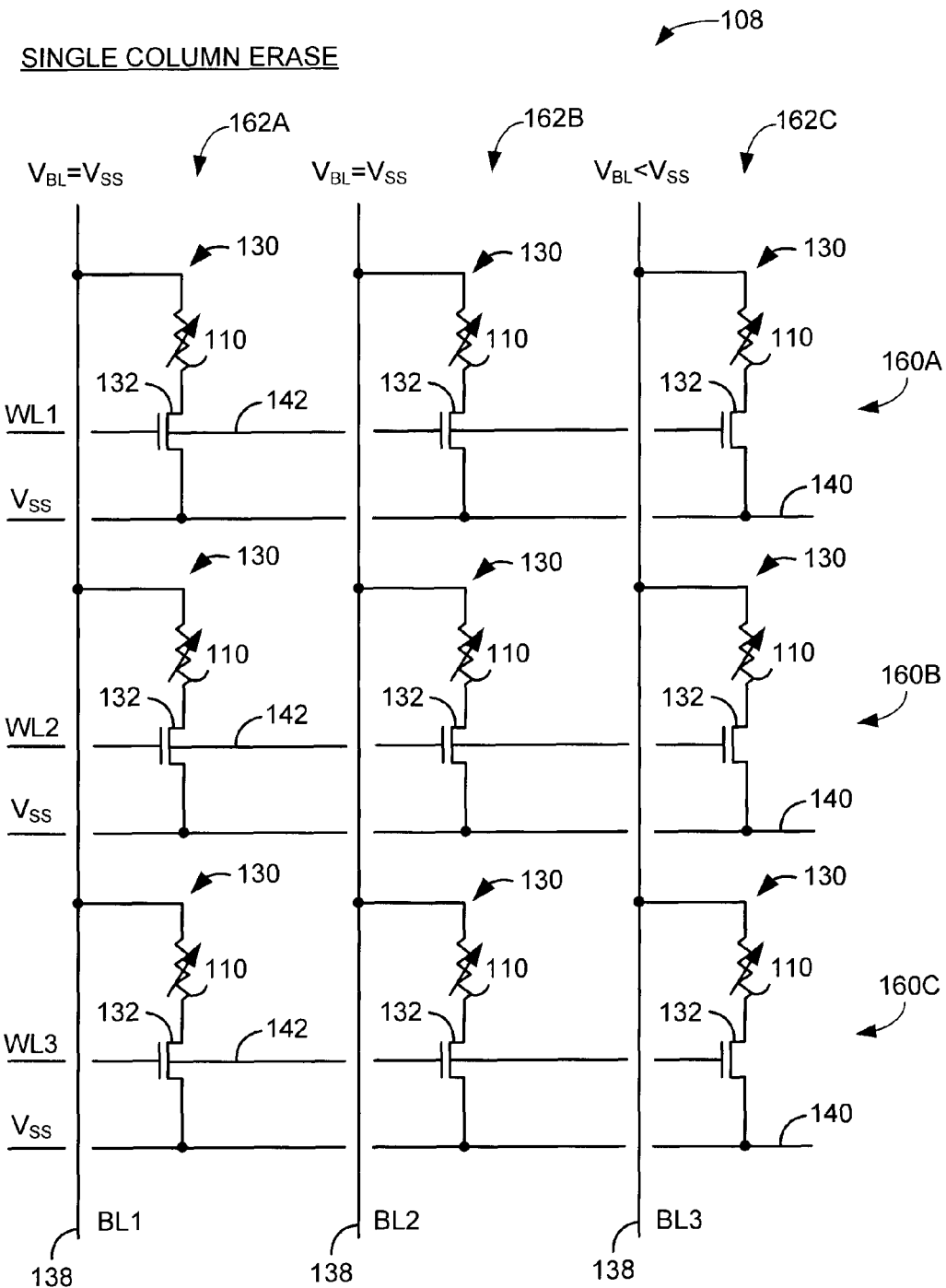
FIGS. 5A-5C show a schematic representation of an array of memory cells from FIG. 4 subjected to respective single column erase, multi-column erase and multi-cell write operations.
Figure 5B:
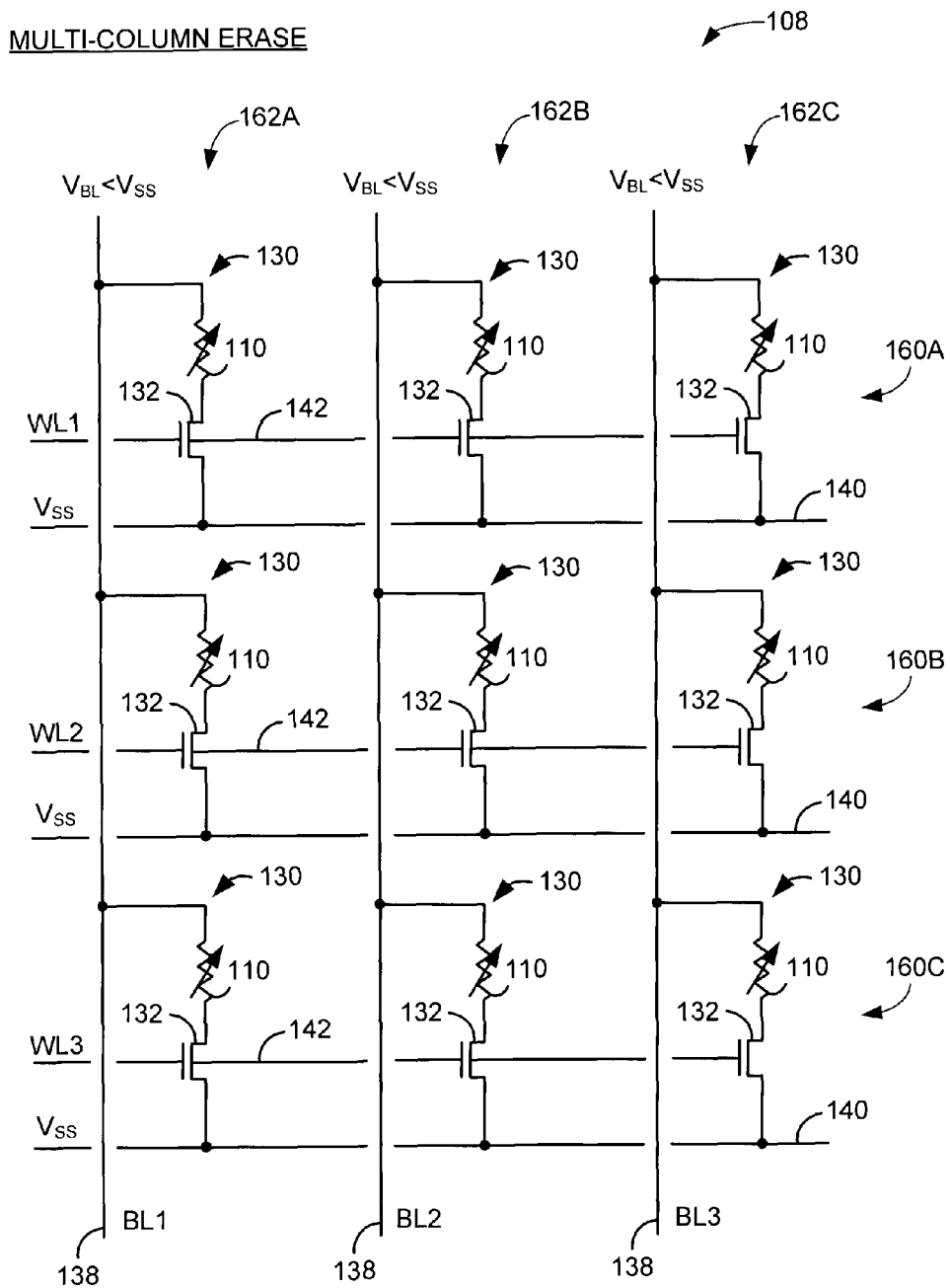
Figure 5C:
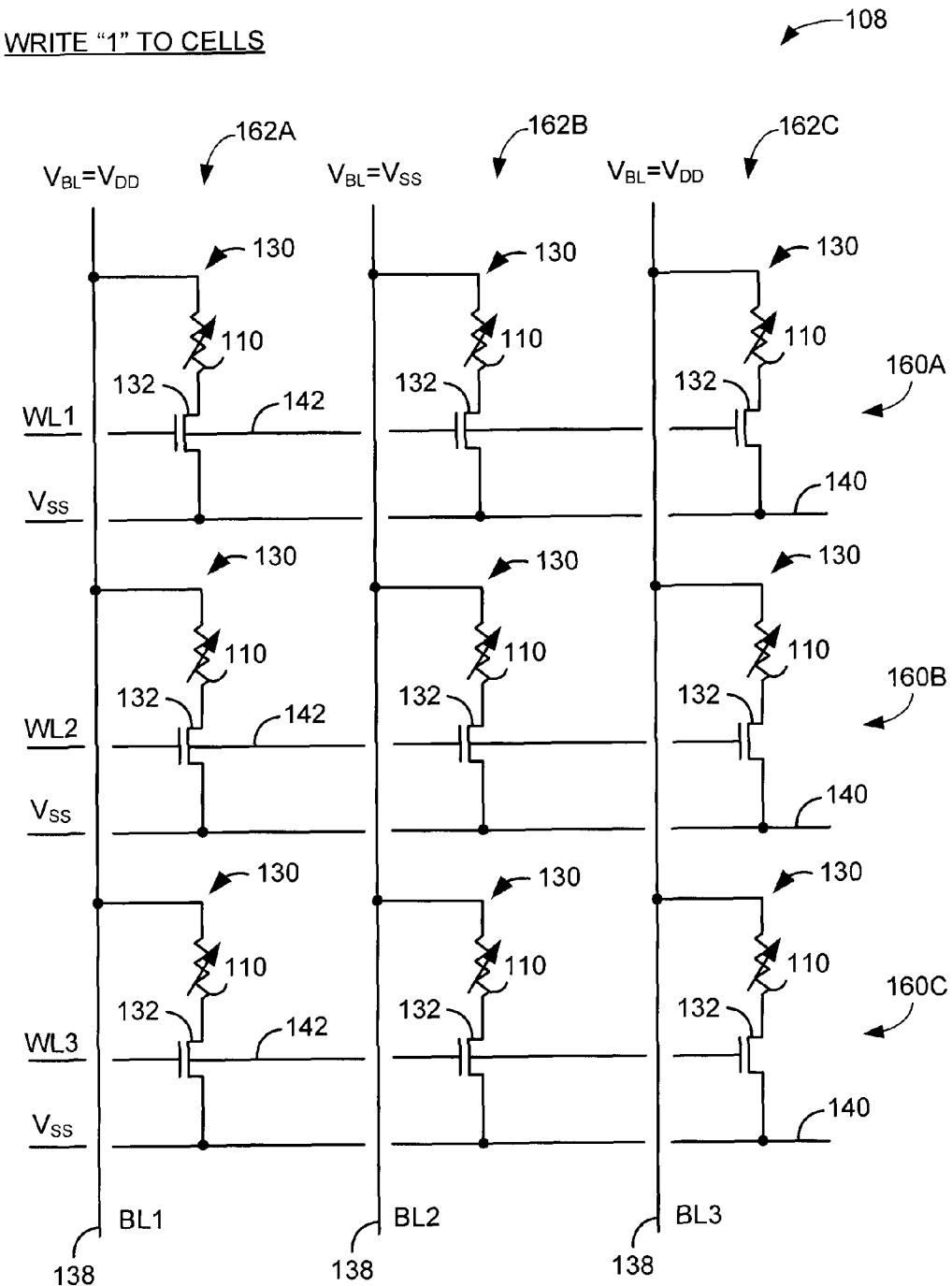

FIGS. 5A-5C show an array of memory cells 130 to illustrate various erase and write operations upon groups of cells. The memory cells 130 can correspond to a selected array 108 from FIG. 1, and are arranged into a series of rows and columns. The rows are denoted 160A-160C and the columns are denoted 162A-162C. While a 3×3 array is shown, it will be appreciated that any respective numbers of rows and columns can be used to form an M×N memory block (such as 32 rows by 4096 columns, etc.). The cells 130 along each row 160A-160C are connected to a common word line 142 (WL1-WL3), and the cells 130 along each column 162A-162C are connected to a common bit line 138 (BL1-BL3).

FIG. 5A illustrates a single column erase operation. In FIG. 5A, column 162C is erased by setting the word lines WL1-WL3 to a suitable reference voltage (e.g., $V_{WL}=V_{SS}$) and setting the voltage of the selected column to a lower voltage $V_{BL}<V_{SS}$. The bit lines 138 of the non-selected columns 162A and 162B are also set to a suitable reference (e.g., $V_{BL}=V_{SS}$). This configuration will write each of the memory cells 130 in the selected column 162C to the erased resistive state, in this case $R_L$ (logical 0). The programmed states of the memory cells 130 in the non-selected columns 162A and 162B will remain unaffected. The other columns 162A, 162B can be respectively erased in like manner.

FIG. 5B shows a multi-column erase operation. In FIG. 5B, the bit lines BL1-BL3 of all three columns 162A-162C are set to the lower voltage $V_{BL}<V_{SS}$, and the word lines WL1-WL3 are set to the reference voltage $V_{SS}$. This sets all of the memory cells 130 to the low resistive state (logical 0).

FIG. 5C shows a selective write operation in which selected memory cells 130 in the array 108 are written to a second resistive state, such as the high resistance $R_H$ (logical 1). The writing of logical 1s in FIG. 5C can be carried out on an individual cell basis, to various cells along a selected row, or to various cells along a selected column.

For example, the first and third memory cells 130 in the first row 160A can be written to the high resistance state by setting the bit lines BL1 and BL3 high ($V_{BL}>V_{SS}$), setting the bit line BL2 to a reference level ($V_{BL}=V_{SS}$), setting the word line WL1 high ($V_{DD}$), and setting the word lines WL2 and WL3 to a reference level (e.g., $V_{BL}=V_{SS}$). This operates to store the bit-sequence "101" along the first row 160A. Cells along a selected column can be similarly written by setting the associated bit line high and individually selecting the word lines for the cells to be written along the selected column.

The data along a selected row or column can be subsequently read in a number of ways. In some embodiments, a page-mode operation is carried out in which read currents are applied by each of the bit lines to cells along a selected row. Sense amplifier circuitry (not shown) can sense the voltage drop across each memory cell along the selected row and latch an output state corresponding to the word data stored along the row.

Figure 6:
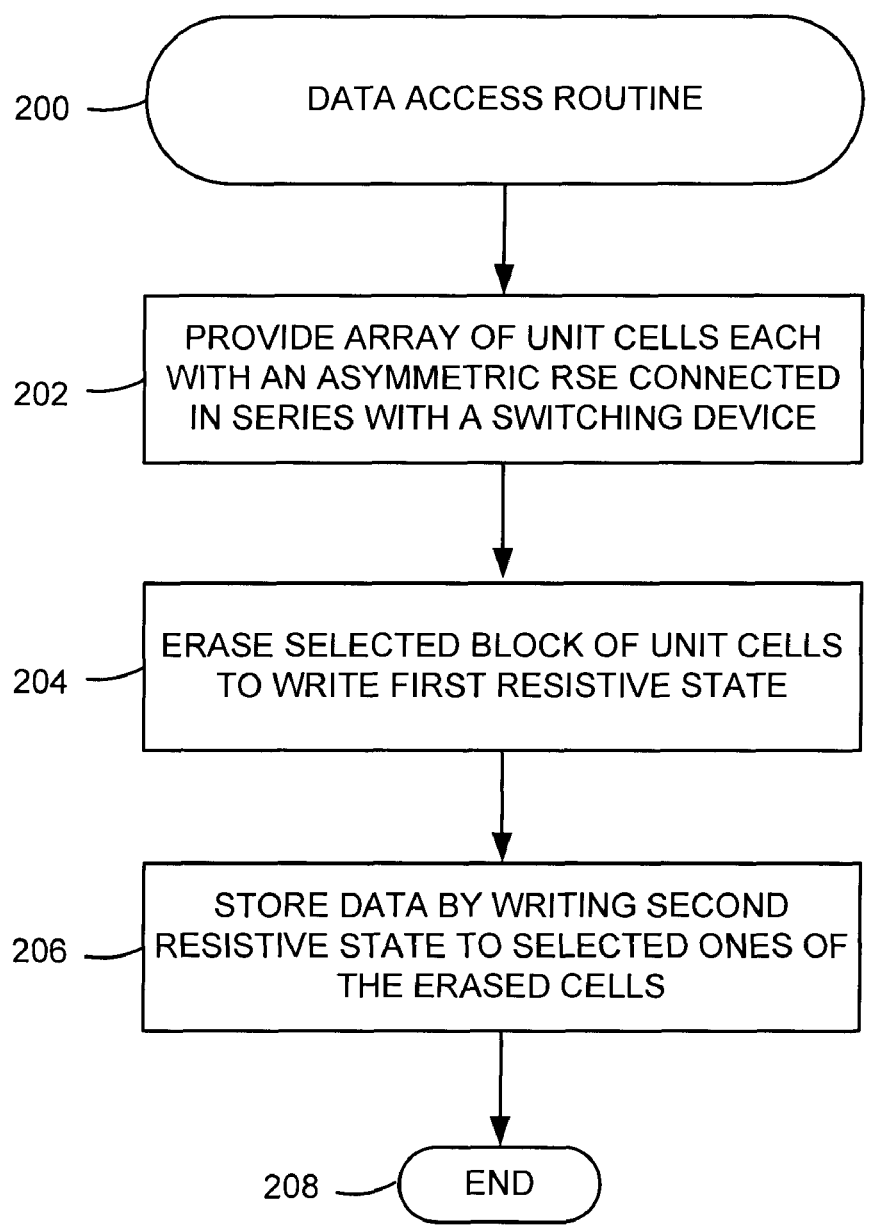
FIG. 6 is a flow chart for a data access routine in accordance with various embodiments.

FIG. 6 provides a DATA ACCESS routine 200 generally illustrative of steps carried out in accordance with the foregoing discussion. At step 202, an array of memory cells is provided with each memory cell having an asymmetric RSE such as 110 and a switching device such as 132. In some embodiments, the memory cells are arranged into rows and columns, with each memory cell connected between a first control line with a variable control voltage and a second control line (reference line) at a fixed reference voltage.

At step 204, a block of the memory cells, such as a selected column or a plurality of selected columns, are erased by setting the memory cells to a first resistive state. In some embodiments, this is carried out by lowering the voltage of the associated first control lines below that of the fixed reference voltage, and flowing a body-drain junction current of the switching device through the associated RSE (FIG. 3A).

At step 206, selected ones of the erased memory cells are subsequently written to a second resistive state, such as by raising the voltage of the first control lines of the selected memory cells to a voltage above that of the fixed reference voltage, and applying a gate control voltage to the switching device (FIG. 3B). The routine then ends at step 208.

As can be appreciated by one skilled in the art, the various embodiments illustrated herein provide a number of advantages over prior art configurations. The source-drain current through the cell transistor is uni-directional because it is only used to write in a single direction, such as the low resistance parallel state of the exemplary MTJ 112 of FIG. 2 in the easy programming direction. The writing of the other state, such as the high resistance anti-parallel state of the MTJ 112 in FIG. 2 uses the body-drain diode current, which can be a higher current consonant with the hard programming direction.

The cell configuration embodied herein facilitates the use of higher spin-torque currents and/or the use of smaller devices. Also, the various embodiments herein allow connection of the source of an NMOSFET to be connected directly to the reference voltage VSS. This enables the use of smaller bit cells and eliminates the need for connections and drivers for an active source line SL since only two active signals connect to each cell (WL and BL). This can provide a more compact layout than prior art configurations.

A block erase approach as embodied herein also allows a large number of cells to be simultaneously written to a selected resistive state (such as logical 0), allowing control circuitry to more closely conform to mature Flash memory control technologies. While STRAM MTJs have been embodied herein, it will be appreciated that the various embodiments can be adapted for any number of different types of RSE and switching device constructions.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A non-volatile memory cell, comprising:
   a transistor comprising source and drain regions spanned by a gate region; and
   a resistive sense element (RSE) connected to the drain region of the transistor, the RSE programmed to a first resistance by flowing a first write current through the RSE and then through the drain and source regions of the transistor, the RSE programmed to a second resistance by flowing a second write current through the drain region and then through the RSE, the second current bypassing the source region.

2. The non-volatile memory cell of claim 1, in which the source region is maintained at a fixed reference voltage during application of the respective first and second write currents.

3. The non-volatile memory cell of claim 2, in which a bit line terminal connected to the RSE opposite the transistor is provided with a voltage greater than the fixed reference voltage during the flow of the first write current, and with a voltage less than the fixed reference voltage during the flow of the second write current.

4. The non-volatile memory cell of claim 1, in which the transistor is formed from a substrate of semiconductor material in which the source and drain regions are provided as spaced-apart localized doped regions with a channel therebetween, the gate region formed adjacent to the channel so that application of a voltage to the gate alters a conductivity of the channel between the respective doped regions.

5. The non-volatile memory cell of claim 1, wherein the source and drain regions are respectively characterized as first and second n+ doped regions in a semiconductor substrate, the substrate further comprising an adjacent p+ doped contact area, wherein the first write current comprises a transistor source-drain current that sequentially flows through the RSE, the second n+ doped region and the first n+ doped region, and wherein the second write current comprises a transistor body-drain current that sequentially flows from the p+ doped contact area across the substrate to the second n+ doped region, and then through the RSE, the transistor body-drain current not passing through the first n+ doped region.

6. The non-volatile memory cell of claim 1, further comprising a voltage source terminal that connects the source region to a reference voltage source to apply a fixed reference voltage thereto, and a bit line terminal connected to the RSE opposite the transistor and adapted to receive a first voltage above the fixed reference voltage to initiate said flow of the first write current, and adapted to receive a second voltage below the fixed reference voltage to initiate said flow of the second write current.

7. The non-volatile memory cell of claim 1, in which the second write current has a magnitude that is greater than a magnitude of the first write current.

8. The non-volatile memory cell of claim 1, in which the memory cell forms a portion of an array of nominally identical memory cells arranged into rows and columns, each memory cell in said array including a separate RSE and transistor having a source region, drain region and a gate region, and wherein each of the source regions of the memory cells in said array are coupled to a source plane connected to a reference voltage source that continuously maintains the source plane at a fixed reference voltage.

9. A semiconductor stack, comprising:
a p doped substrate in which spaced-apart first and second n+ doped regions and a p+ doped contact area are formed, the first n+ doped region and the p+ doped contact area respectively maintained at a fixed reference voltage;
a gate structure which spans a channel between the first and second n+ doped regions to form a transistor; and
a resistive sense element (RSE) connected to the second n+ doped region, the RSE programmed to a first resistance by flowing a transistor body-drain current from the p+ doped contact area to the second n+ doped region and then to the RSE, the RSE programmed to a different second resistance by flowing a transistor source-drain current through the RSE to the second n+ doped region, and across the transistor channel to the first n+ doped region.

10. The semiconductor stack of claim 9, further comprising voltage source terminals that respectively connect the first n+ doped region and the p+ doped contact area to at least one reference voltage source to maintain the first n+ doped region and the p+ doped contact area at said fixed reference voltage.

11. The semiconductor stack of claim 9, further comprising a bit line terminal connected to the RSE and adapted to receive a first voltage below the fixed reference voltage to initiate said flow of the transistor body-drain current, and adapted to receive a second voltage above the fixed reference voltage to initiate said flow of the transistor source-drain current.

12. The semiconductor stack of claim 9, in which the RSE is connected in series with the transistor between first and second control lines, the first control line connected to the RSE to provide a variable voltage thereto, the second control line connected to the first n+ doped region to provide the fixed reference voltage thereto.

13. The semiconductor stack of claim 9, further comprising a word line terminal connected to said gate which applies a first gate voltage equal to the fixed reference voltage during said flow of the transistor body-drain current and which applies a second gate voltage greater than the fixed reference voltage during said flow of the transistor source-drain current.

14. The semiconductor stack of claim 9, in which the first n+ doped region forms a source for the transistor, the second n+ doped region forms a drain for the transistor, and a portion of the p doped substrate between said first and second n+ doped regions forms said channel.

15. The semiconductor stack of claim 9, in which the source-drain current passes through the first n+ doped region and the transistor body-drain current does not pass through the first n+ doped region.

16. The semiconductor stack of claim 9, in which the body-drain current has a magnitude that is greater than a magnitude of the source-drain current.

17. A method comprising:
providing a memory cell comprising a transistor connected in series with a resistive sense element (RSE), the transistor comprising source and drain regions spanned by a gate region, the RSE connected to the drain region, and the source region maintained at a fixed reference voltage;
programming the RSE to a first electrical resistance by flowing a first write current through the memory cell that sequentially passes through the RSE and then through the drain and source regions of the transistor; and
programming the RSE to a different, second resistance by flowing a second write current through the memory cell that sequentially passes through the drain region and then through the RSE, the second write current bypassing the source region of the transistor.

18. The method of claim 17, in which the transistor is formed from a substrate of semiconductor material in which the source and drain regions are respectively provided as spaced-apart first and second n+ doped regions with a channel therebetween, the gate region formed adjacent to the channel so that application of a voltage to the gate alters a conductivity of the channel between the respective first and second n+ doped regions.

19. The method of claim 18, in which the RSE is programmed to the second resistance by flowing the second write current as a body-drain current that passes from a p+ doped contact area of the substrate and across a pn junction to the second n+ doped region while bypassing the first n+ doped region.

20. The method of claim 17, in which the second write current has a magnitude that is greater than a magnitude of the first write current.

* * * * *